(12) United States Patent
Smith

(10) Patent No.: US 6,356,576 B1
(45) Date of Patent: Mar. 12, 2002

(54) DEEP ULTRAVIOLET CATADIOPTRIC ANAMORPHIC TELESCOPE

(75) Inventor: Scott T. Smith, San Diego, CA (US)

(73) Assignee: Cymer, Inc., San Diego, CA (US)

( * ) Notice: Subject to any disclaimer, the term of this patent is extended or adjusted under 35 U.S.C. 154(b) by 0 days.

(21) Appl. No.: 09/450,919

(22) Filed: Nov. 29, 1999

(51) Int. Cl.[7] .......................... H01S 3/08; G02B 17/00; G02B 13/14; G02B 3/00

(52) U.S. Cl. ........................ 372/102; 359/366; 359/355; 359/723; 359/731

(58) Field of Search .................. 372/102; 359/726–732, 359/366, 355

(56) References Cited

U.S. PATENT DOCUMENTS

| | | | |
|---|---|---|---|
| 4,016,504 A | 4/1977 | Klauminzer | 331/94.5 |
| 4,475,793 A | * 10/1984 | Ford | 350/172 |
| 5,717,518 A | * 2/1998 | Shafer et al. | 359/357 |
| 5,852,627 A | 12/1998 | Ershov | 372/108 |
| 6,084,706 A | * 7/2000 | Tamkin et al. | 359/366 |
| 6,160,831 A | * 12/2000 | Kleinschmidt et al. | 372/57 |

OTHER PUBLICATIONS

J.N Howard and P.R. Wakeling: *Applied Optics;* Apr. 1972; p. A5–A6; Optical Society of America.

T.W. Hansch; *Repetitively Pulsed Tunable Dye Laser For High Resolution Spectroscopy;* Apr. 1972; p. 895–898.

Warren J. Smith; optics Toolbox, Genesis Optics Software; Library of Congress Cataloging in Publication Data; 1992 Cover Page; p. 285 and 292.

F.T. Arecchi; Laser Handbook; vol. 5; 1985; cover page, index page, pp. 1–2, 45–46, 214–219..

* cited by examiner

Primary Examiner—Leon Scott, Jr.
Assistant Examiner—Armando Rodriguez
(74) Attorney, Agent, or Firm—John R. Ross, Esq.

(57) ABSTRACT

A catadioptric anamorphic beam expanding telescope expands an optical beam in a first axis substantially perpendicular to the beam propagation axis, and deflects it in a plane substantially perpendicular to the first axis. The beam expanding telescope can include reflective, refractive, and combined reflective/refractive elements. An embodiment includes an off axis convex spheric reflector and an off axis combined reflective/reflective optical element, commonly known as a Mangin mirror, incorporating a refractive first surface and a reflective rear surface, which compensate for aberrations introduced by the off axis deflection of the beam. The telescope is particularly useful for deep ultraviolet (DUV) applications at wavelengths shorter than about 250 nm. In some applications, the telescope illuminates a diffraction grating or other wavelength dispersive element, aligned to retroreflect a preferential wavelength, thereby providing wavelength narrowing. In some applications a combined telescope and diffraction grating are incorporated within a laser optical cavity, thereby narrowing the output wavelength spectrum of the laser. Embodiments are advantageous for intracavity line narrowing in an electric discharge laser, such as a KrF excimer laser, ArF excimer laser, or $F_2$ molecular laser. Additionally, embodiments in accordance with the present invention provide an improved general purpose DUV beam expander.

29 Claims, 5 Drawing Sheets

DEEP ULTRAVIOLET CATADIOPTRIC ANAMORPHIC TELESCOPE

CROSS REFERENCE TO RELATED APPLICATIONS

This application is related to "Beam Expander For Ultraviolet Lasers", By Watson; U.S. application Ser. No. 09/102,241, filed Sep. 22, 1998, now U.S. Pat. No. 6,163,559 issued Dec. 19, 2000 and commonly assigned, the specification of which is incorporated herein by reference in its entirety.

FIELD OF THE INVENTION

This invention relates to deep ultraviolet catadioptric anamorphic beam expanders, particularly for use in linewidth narrowing in pulsed lasers, including pulsed electric discharge lasers.

BACKGROUND

Various types of pulsed lasers, including electric discharge lasers, e.g., excimer lasers, and optically pumped dye lasers, typically produce an output beam having a comparatively wide spectral linewidth. For many applications, e.g., microlithography, it is important for the output beam to have a narrow spectral linewidth. To reduce laser spectral linewidth, a number of line narrowing package (LNP) designs have been devised. For example Hansch, "Repetitively Pulsed Tunable Dye Laser for High Resolution Spectroscopy", Applied Optics vol. 11, No. 4,895–898, April 1972, describes a line narrowing package for a dye laser incorporating an intracavity beam expanding telescope together with a diffraction grating mounted in a Littrow arrangement.

It is well known in the art that the wavelength selectivity (or chromatic resolving power) of a diffraction grating is directly proportional to the width of the incident beam on the grating perpendicular to the direction of the grating rulings (see Hansch, cited above). Therefore, in order to maximize the wavelength selectivity of a diffraction grating, a beam expander can be used advantageously. The purpose of a beam expander is to enlarge the beam cross-section to illuminate the entire width of the diffraction grating. Because linear diffraction gratings have dispersive properties in only one axis, it is therefore sufficient to expand the beam in one axis only. Anamorphic beam expansion, which is beam expansion in one axis, can be accomplished by various methods.

A traditional method is to use right angle prisms (see for example Klauminzer, U.S. Pat. No. 4,016,504, issued Apr. 5, 1977. FIG. 1A is a schematic diagram illustrating a current line narrowing package 100 (see Ershov; U.S. Pat. No. 5,852,627, "Laser with Line Narrowing Output Coupler" issued Dec. 22, 1998, and incorporated herein by reference in its entirety, which employs right angle prisms 110 for anamorphic expansion of a beam 102. An expanded substantially parallel beam 104 is reflected from a substantially plane mirror surface onto a diffraction grating 108 at a large angle of incidence. Since the purpose of the prisms 110 is to expand beam 102, a maximum amount of expansion per prism is desirable. From Snell's Law it can be deduced by those skilled in the art that this is readily accomplished with a right angle prism. FIG. 1B is a schematic diagram illustrating the expansion of a beam 122 by a single right angle prism 120. Beam 122 is incident on a prism face 124 at an incidence angle ($\alpha$, and is refracted through right angle prism 120. An expanded beam 126 exits right angle prism nearly normal to the surface of a leg 128 of right angle prism 120. A limitation of this method is that, in order to produce a significant beam expansion with a small number of prisms, beam 122 must have a large incidence angle $\alpha$ relative to the face of right angle prism 120. Current designs typically require an incidence angle $\alpha$ of approximately 74 degrees. At these large angles, antireflective (AR) coatings 130 are difficult to produce. This is especially true for high energy deep ultraviolet (DUV) beams produced by excimer lasers. DUV generally refers to wavelengths shorter than 300 nm and longer than 200 nm. Excimer laser wavelengths of principal relevance to the present invention are 248 nm, 193 nm and 157 nm. Therefore, two of these wavelengths are actually shorter than 200nm and can technically be referred to as EUV (extreme ultraviolet), although the EUV distinction is commonly reserved for wavelengths shorter than 100 nm.

DUV beam expanders are in general difficult to make. Large incidence angle AR coatings and particularly large angle DUV AR coatings are difficult to make for a variety of reasons. First, there are only a few materials that are transparent in the DUV. This limits the material choices to those whose indices of refraction are similar. Therefore to achieve a useful coating, the coating must be made of many layers. Multilayer coatings are more difficult to make because tighter constraints are needed on individual layer thicknesses. Also, because of the DUV wavelength there can be greater absorption in the coating. This can lead to blistering or damage to the coating because of the extremely high energy of the photons. Not only do the coatings have to be effective (<1% Reflective), which dictates multilayer coatings, but the coatings must also be able to withstand high energy pulses for billions of shots.

Another limitation of prism beam expanders is thermal nonuniformity. As light rays propagate through the bulk material of the prisms, optical energy is partially absorbed, thereby heating the prism material. There is a large variation between the actual path lengths that different light rays traverse through a prism. Rays that are incident near an apex of a prism, for example ray 122a, travel a short distance through the prism, whereas rays incident near a leg of the prism, for example ray 122b, propagate a long distance through the prism (see FIG. 1B). This nonuniform propagation of rays through the prisms creates nonuniform thermal gradients inside the prisms, which lead to optical wavefront aberrations. The thermal gradients inside the prisms become increasingly more important as wavelengths decrease and pulse repetition rates increase.

Although heat generated per unit optical pathlength (and therefore per unit volume) is substantially uniform, nonuniform thermal distortion in the prism results from nonuniform cooling, because cooling takes place at the prism surface, which is not equidistant from all points within the prism volume. The surface area per volume changes significantly for differing propagation paths through a prism. For example, a propagation path close to the apex of the prism has greater heat conduction to the surface than does a path closer to a leg of the prism. Additionally, nonuniform temperature distributions are produced by the finite heat transfer time of the prism. Intense short bursts of energy produce significant transient nonuniformities. Excimer lasers are typically operated in bursts of pulses with varying time intervals between bursts. It is observed that the current LNP performs differently, depending on the burst duty cycle (the time interval between consecutive bursts of pulses).

It is therefore desirable in the art to provide a method and system for linewidth narrowing in an electric discharge laser having minimal optical elements and complexity, that eliminates large incidence angles and associated antireflective coatings and that reduces vulnerability to thermal distortion and damage. Additionally, it is desirable in the art to provide an improved general purpose DUV beam expander.

SUMMARY OF THE INVENTION

A catadioptric anamorphic beam expanding telescope is described, having optical power in a first axis substantially perpendicular to the beam propagation axis. As it propagates through the telescope, the beam is expanded in the first axis, and is deflected in a plane substantially perpendicular to the first axis by off-axis optical elements, thereby providing unobscured beam expansion. The optical elements of the beam expanding telescope can include reflective, refractive, and combined reflective/refractive elements.

In one embodiment, a catadioptric anamorphic beam expanding telescope includes an off axis convex spheric reflector and an off axis combined reflective/reflective optical element, commonly known as a Mangin mirror. The Mangin mirror includes a refractive first surface and a reflective rear surface, which are configured to compensate for aberrations introduced by the off axis deflection of the beam. The catadioptric anamorphic beam expanding telescope is particularly useful for deep ultraviolet (DUV) applications at wavelengths shorter than about 250 nm. For these applications, refractive elements of the telescope are fabricated advantageously from calcium fluoride ($CaF_2$).

In some applications, the catadioptric anamorphic beam expanding telescope is used to illuminate a diffraction grating or other wavelength dispersive element. A diffraction grating aligned with a catadioptric anamorphic beam expanding telescope retroreflects a preferential wavelength, and thereby provides wavelength narrowing or "line narrowing". In some applications the combined catadioptric anamorphic beam expanding telescope and diffraction grating are incorporated within a laser optical cavity, thereby narrowing the output wavelength spectrum of the laser. Embodiments of the present invention are particularly advantageous for intracavity line narrowing in an electric discharge laser, such as a KrF excimer laser, ArF excimer laser, or $F_2$ molecular laser.

Embodiments in accordance with the present invention provide a method and system using catadioptric, anamorphic optical design for linewidth narrowing of an electric discharge laser. The embodiments involve minimal optical elements and complexity, and avoid difficult and costly a spheric optics, such as conic cylindrical optics. The embodiments eliminate large incidence angles and associated antireflective coatings, and thereby reduce vulnerability to thermal distortion and damage. Additionally, embodiments in accordance with the present invention provide an improved general purpose DUV beam expander.

The present invention is better understood upon consideration of the detailed description below, in conjunction with the accompanying drawings.

BRIEF DESCRIPTION OF THE DRAWINGS

The present invention may be better understood, and its numerous objects, features, and advantages made apparent to those skilled in the art by referencing the accompanying drawings. For simplicity and ease of understanding, the use of similar reference symbols in different drawings indicates similar or identical items.

DETAILED DESCRIPTION OF THE EMBODIMENT(S)

The following is a detailed description of illustrative embodiments of the present invention. As these embodiments of the present invention are described with reference to the aforementioned drawings, various modifications or adaptations of the methods and or specific structures described may become apparent. These descriptions and drawings are not to be considered in a limiting sense as it is understood that the present invention is in no way limited to the embodiments illustrated.

Figure 1A:
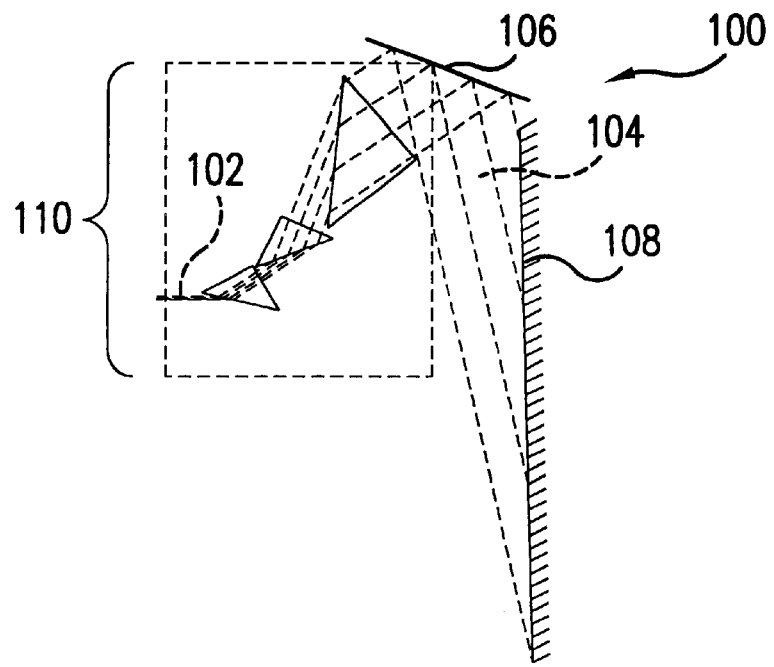
FIG. 1A is a schematic diagram illustrating a current line narrowing package design, which uses right angle prisms for anamorphic expansion of a beam.
Figure 1B:
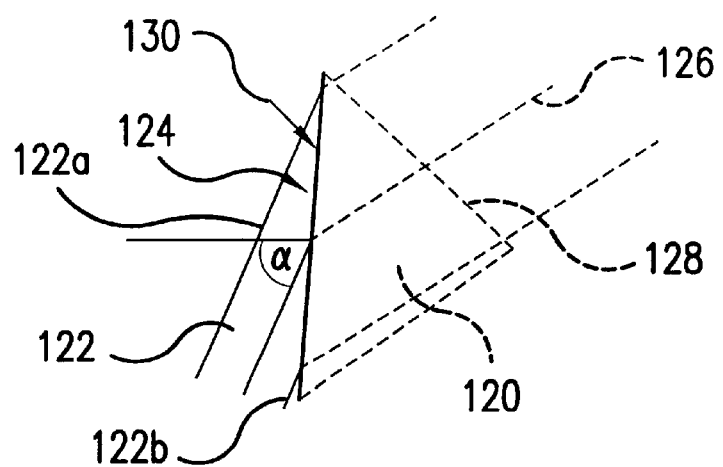
FIG. 1B is a schematic diagram illustrating the expansion of a beam by a single right angle prism.
Figure 2A:
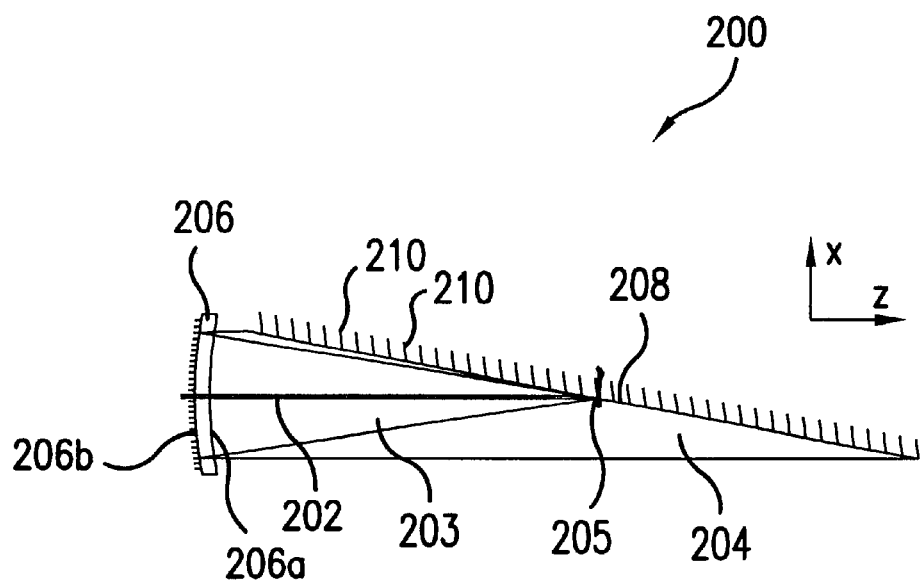
FIGS. 2A and 2B are schematic top and side views respectively of a line narrowing package (LNP) incorporating a catadioptric anamorphic beam expanding telescope, in accordance with an embodiment of the invention.
Figure 2B:
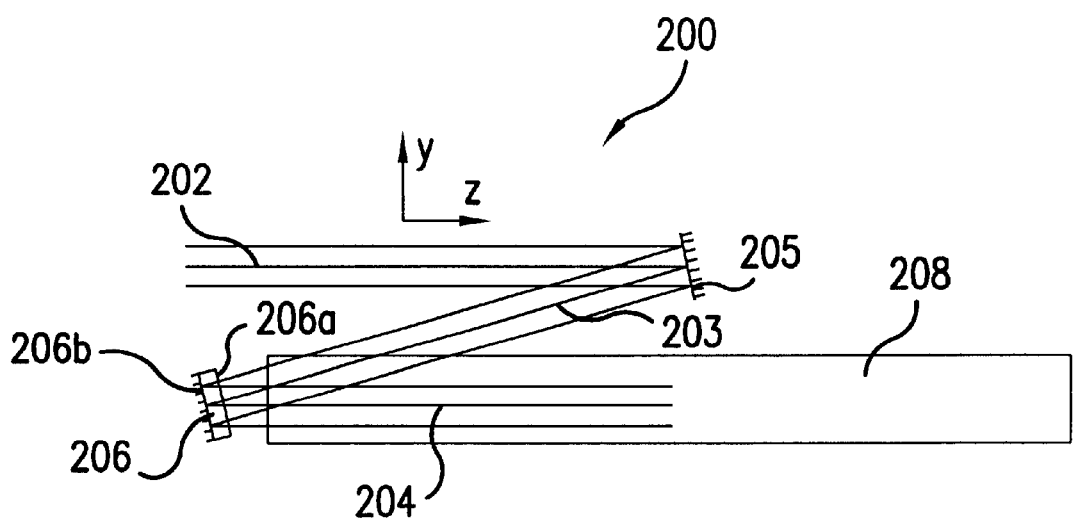
Figure 3A:
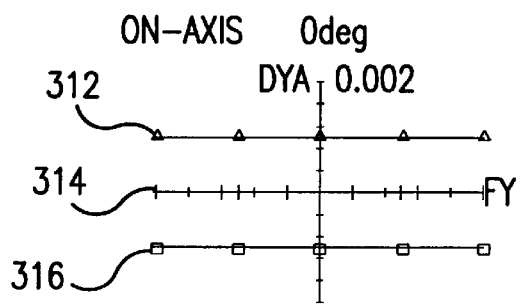
FIGS. 3A–3F are ray intercept diagrams indicating the performance of a catadioptric anamorphic beam expanding telescope, in accordance with an embodiment of the invention.
Figure 3B:
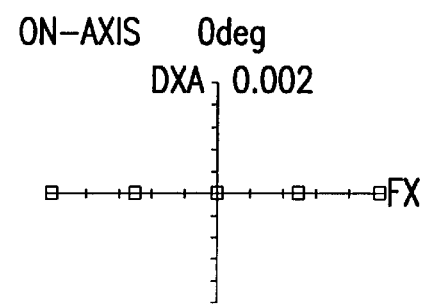
Figure 3C:
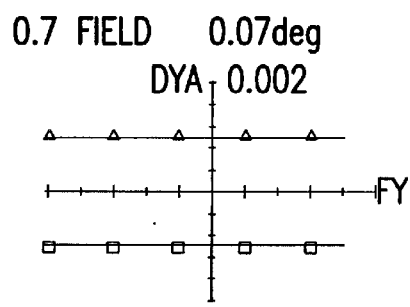
Figure 3D:
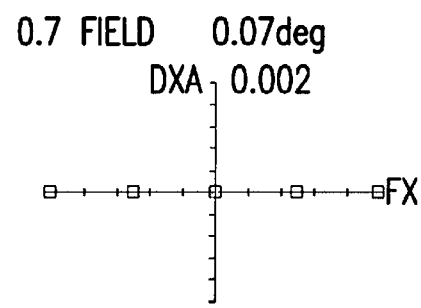
Figure 3E:
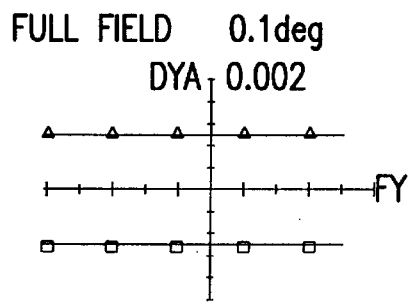
Figure 3F:
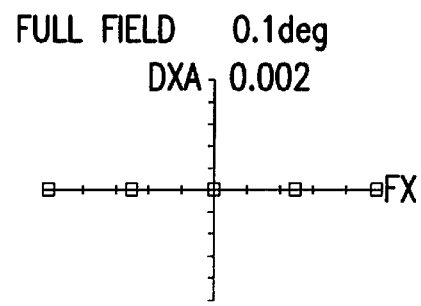

FIGS. 2A and 2B are schematic top and side views respectively of a line narrowing package (LNP) 200 incorporating a catadioptric anamorphic beam expanding telescope, in accordance with an embodiment of the invention. The beam expanding telescope consists of two optical elements, namely a convex cylindrical mirror 205 and a Mangin mirror 206, described below in more detail, or optical equivalent. A substantially parallel light beam 202 is expanded by reflection from cylindrical mirror 205 to produce expanding beam 203, which reflects from Mangin mirror 206 to produce an expanded substantially parallel light beam 204, which illuminates a diffraction grating 208 having rulings 210. Substantially parallel light beam 204 is expanded in only one axis X, substantially perpendicular to the direction Y of grating rulings 210 and to beam propagation axis Z of substantially parallel light beam 202. Therefore beam expanding telescope 205, 206 has optical power only in the X axis. Diffraction grating 208 is oriented in a Littrow mounting arrangement, such that light of a preselected wavelength is preferentially retroreflected by diffraction grating rulings 210, thereby retracing the paths of light beams 204, 203, and 202 sequentially.

To produce an unobscured reflective beam expander, telescope optics 205 and 206 are tilted off axis. This tilt introduces optical aberrations, which degrade the performance of the system. It will be recognized by those skilled in the art that the tilt of telescope optics 205, 206 used to produce an unobscured beam expander can be oriented in either X or Y transverse axis. The anamorphic property of the beam expansion system can then be used advantageously to reduce the optical aberrations. If the tilt occurs predominantly in the Y axis having no optical power, aberrations are minimized.

In a catadioptric system, such as LNP 200 illustrated in FIGS. 2A–2B, a refractive optical element is added to correct the aberrations of reflective optical elements. To reduce the number of elements used in LNP 200, a Mangin mirror 206 is used. A Mangin mirror, combining a refractive front (or first) surface with a reflective rear surface, is well known in the art (see Smith, Warren J., "Modern Lens Design", McGraw-Hill, N.Y. 1992, page 285. A Mangin mirror combines curvature of a front surface 206a with curvature of a rear surface 206b to correct aberrations.

Alternatively, to correct or reduce off axis optical aberrations, one or more of the optical elements can be made a spheric. Since in this particular application optical power is required in only one axis, the optical element can be an a spheric cylinder or conic cylinder. However, conic cylindrical optics are generally extremely difficult and costly to manufacture.

A catadioptric beam expander, according to the present invention, makes use of aberration reducing techniques described above. It makes use of a Mangin mirror and of a judicious choice of tilt axis to produce a well corrected, unobscured, anamorphic beam expansion system without requiring the use of a spheric optics.

The following describes an example of a catadioptric LNP specifically designed for a nominal wavelength of 193.35 nm. Referring to FIGS. 2A and 2B, LNP 200 is designed for double-pass beam propagation, with optical surfaces laid out in the order in which the optical rays intercept them, having a beam propagation path folded about the reflective surface of diffraction grating 208. The first optical surface in the beam propagation path of substantially parallel light beam 202 is convex cylindrical mirror 205 having a radius of curvature of approximately 16.00 mm. Positioned approximately 148.776 mm from convex cylindrical mirror 205 along the beam propagation path of reflect expanding beam 203 is the first surface 206a of Mangin mirror 206, which is a cylindrically concave refracting surface having a radius of curvature of approximately 163.78 mm. The beam propagates through the interior of Mangin mirror 206 made of calcium fluoride ($CaF_2$) having a thickness of approximately 5.00 mm and a refractive index of approximately 1.501, and is reflected at the rear surface 206b of Mangin mirror 206. Rear surface 206b is cylindrically concave with a radius of curvature of approximately 243.78 mm. The optical rays of expanded substantially parallel light beam 204 are thereby reflected back through the interior of Mangin mirror 206 and are refracted again at first surface 206a as they emerge from Mangin mirror 206. Next, expanded substantially parallel light beam 204 illuminates diffraction grating 208, which is located approximately 135 mm from first surface 206a along the propagation path of beam 204. Because of its Littrow mounting arrangement, diffraction grating 208 retroreflects the beam to retrace its propagation path through the entire optical train including above identified elements 206a, 206, 206b, 206, 206a, and 205. Because beam 204 is substantially parallel, the optical properties of LNP 200 are largely insensitive to the precise optical path length between Mangin mirror 206 and diffraction grating 208.

FIGS. 3A–3F are six ray intercept diagrams indicating the performance of LNP 200. In particular FIGS. 3A–3F show the predicted dispersion or wavelength selectivity of the LNP system at given field angles, using ray trace analysis techniques well known to those having skill in the art. The y axes of diagrams 3A, 3C, 3E are labeled DYA, and the y axes of diagrams 3B, 3D, and 3F are labeled DXA, respectively. DYA axis represents the angular displacement of the rays, in units of radians, traced through the optical system in a plane perpendicular to the rulings in diffraction grating 208. DXA axis represents the angular displacement of the rays, in units of radians, traced through the optical system in a plane parallel to the rulings in the diffraction grating. Each division of the y axis represents 0.0004 radian. The x axes of diagrams 3A–3F are the fractional ray heights of the entrance beam (distances from the optic axis normalized to full aperture radius) and are labeled FY and FX respectively.

Diagrams 3A and 3B display the performance of LNP 200 "on axis", which means a field angle of zero degrees. Diagrams 3C and 3D show the performance at a field angle of 0.07 degrees or 0.7 times the total field angle of 0.1 degrees. Diagrams 3E and 3F show the performance at a full field or 0.1 degrees. Analyzing "on axis" diagram 3A, one can see three curves (which appear as substantially horizontal parallel lines). Each of the curves (lines) 312, 314, and 316 represents data for a respective wavelength 193.349 nm, 193.350 nm, and 193.351 nm, identified by symbols shown in the figures.

Diffraction grating 208 is aligned to retroreflect the nominal 193.350 nm wavelength. Accordingly, curve 314 that represents the nominal wavelength shows virtually no angular change across the entire entrance aperture. For a shift in wavelength of 0.001 nm from the nominal wavelength of 193.350 nm, there is a corresponding angular change of approximately 0.001 radian, as shown by the vertical positions of curves 312 and 316. Accordingly, the dispersion of LNP system 200 is approximately 1 milliradian per picometer. There is no vertical separation between the curves (lines) in diagrams 3B, 3D, and 3F, with DXA axes, because linear diffraction grating 208 has dispersion in only the y axis. The horizontal lengths of the curves in diagrams 3A and 3B represent the full aperture diameter. The corresponding curves in diagrams 3C–3F appear slightly shortened and asymmetric horizontally due to vignetting near the edge of the aperture.

Figure 4A:
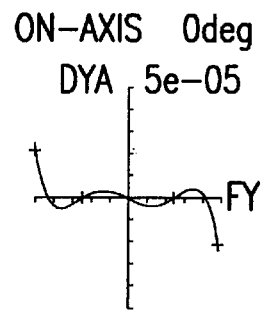
FIGS. 4A–4F are diagrams showing ray intercept curves for only one wavelength.
Figure 4B:
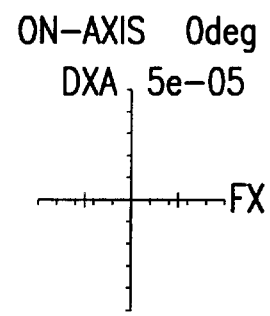
Figure 4C:
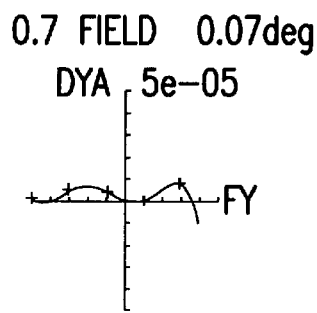
Figure 4D:
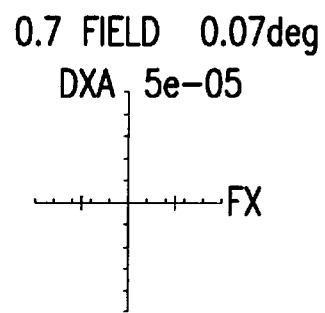
Figure 4E:
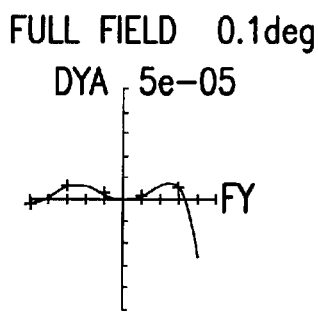
Figure 4F:
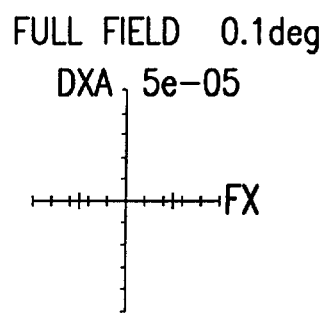
Figure 5B:
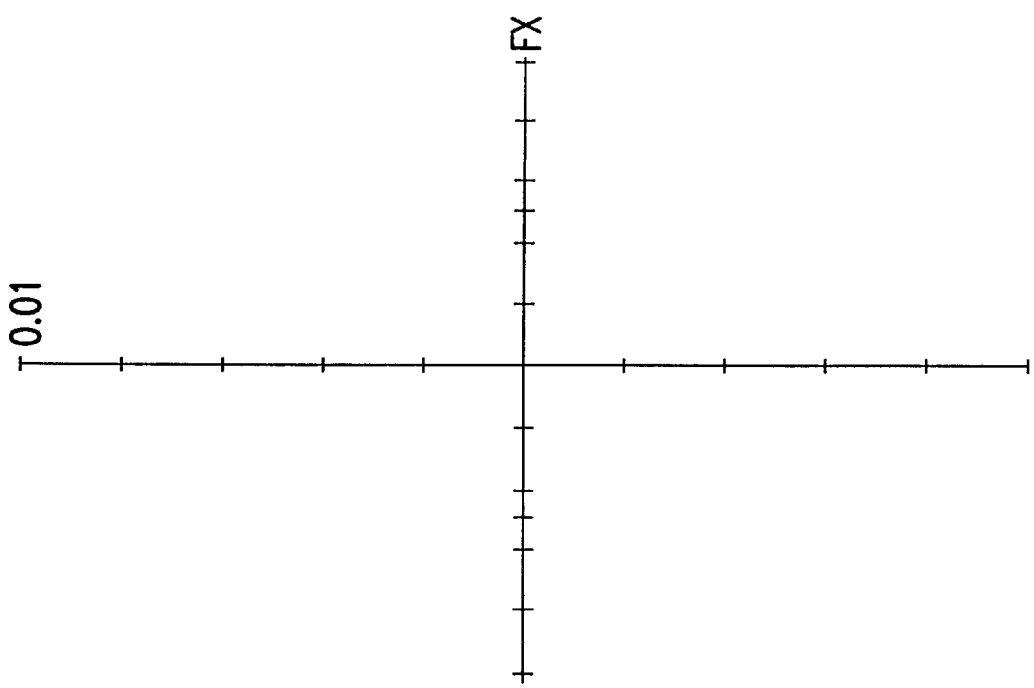
FIGS. 5A and 5B are diagrams showing wavefront differences due to monochromatic aberrations for a LNP system.
Figure 5A:
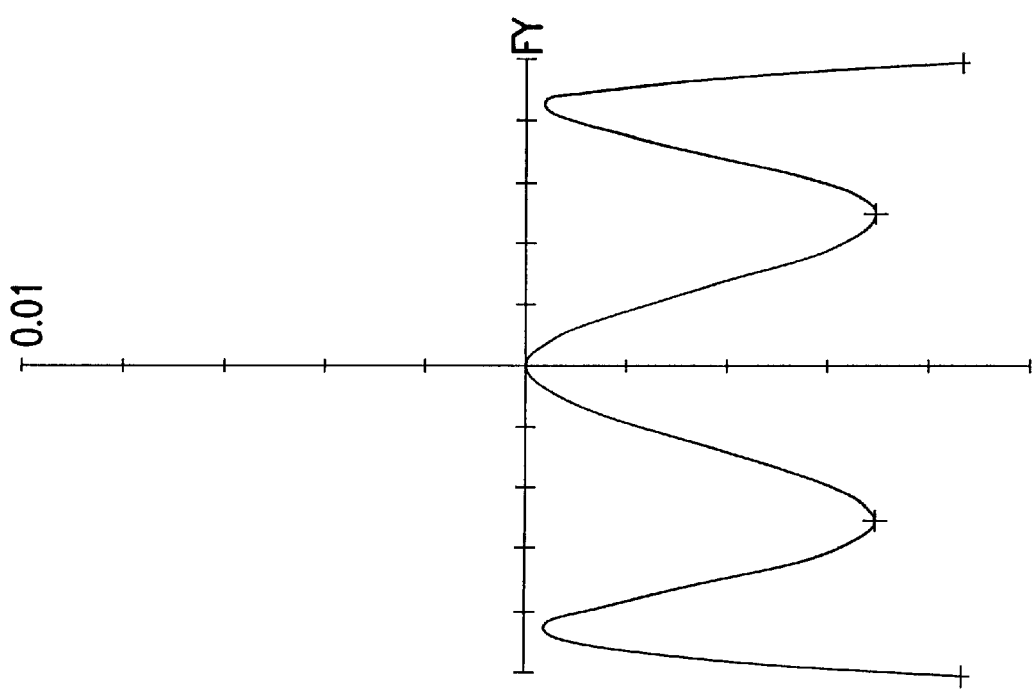

That the curves in diagrams 3A–3F appear as substantially straight lines is evidence that the dispersion of LNP system 200 is orders of magnitude larger than the angular changes in the rays created by optical aberrations in the system. To illustrate the monochromatic aberrations of LNP system 200, FIGS. 4A–4F show ray intercept curves for only one wavelength, corresponding to ray intercept curves for three wavelengths shown in FIGS. 3A–3F. Each division of the y axis of diagrams 4A–4F represents $1 \times 10^{-5}$ radian. The x-axis units and scales are the same as in diagrams 3A–3F. As shown in diagrams 4A–4F, the worst case peak-to-peak angular difference in the ray intercept due to monochromatic aberrations for the DYA axis is approximately 0.04 milliradians. Similar to the curves of FIGS. 3B, 3D, and 3F, the curves of FIGS. 4B, 4D, and 4F show negligible aberrations for the DXA axis. FIGS. 5A and 5B show the corresponding wavefront differences due to monochromatic aberrations for LNP system 200. In FIGS. 5A and 5B the y axis units are waves relative to the nominal operating wavelength with each division representing 0.002 waves, whereas the x axis units and scales are substantially the same as in FIGS. 3A–3F and 4A–4F. A peak-to-peak angular difference of approximately 0.04 milliradians translates to a peak-to-peak wavefront difference of approximately 0.008 waves at 193.350 nm in the y axis, as illustrated in the curve of FIG. 5A. The curve of FIG. 5B, on the other hand, shows a negligible wavefront difference in the x axis, which contains no optical power. Accordingly, the nominal performance of LNP system 200 is corrected to a peak-to-peak wavefront error that is less than $\frac{1}{100}$ of the nominal system wavelength.

Therefore, embodiments in accordance with the present invention provide a method and system using catadioptric, anamorphic optical design for linewidth narrowing of an electric discharge laser, such as a KrF excimer laser, ArF excimer laser, or $F_2$ molecular laser. The embodiments require minimal optical elements and complexity, and avoid difficult and costly a spheric optics, such as conic cylindrical optics. The embodiments eliminate large incidence angles and associated antireflective coatings, and thereby reduce vulnerability to thermal distortion and damage. Additionally, embodiments in accordance with the present invention provide an improved general purpose DUV beam expander.

While embodiments of the present invention have been shown and described, changes and modifications to these illustrative embodiments can be made without departing from the present invention in its broader aspects. Thus it should be evident that there are other embodiments of this invention which, while not expressly described above, are within the scope of the present invention. Therefore, it will be understood that the appended claims necessarily encompass all such changes and modifications as fall within the described invention's true scope; and further that this scope is not limited merely to the illustrative embodiments presented to demonstrate that scope.

What is claimed is:

1. An apparatus for transforming a light beam having a wavelength and a propagation axis comprising:
    a catadioptric anamorphic beam expanding telescope having optical power in a first axis substantially perpendicular to said propagation axis;
    wherein said light beam includes an expanded beam portion that is expanded in said first axis by said beam expanding telescope and said light beam is deflected in a plane substantially perpendicular to said first axis.

2. The apparatus of claim 1, wherein said beam expanding telescope comprises a reflective optical element.

3. The apparatus of claim 1 wherein said beam expanding telescope comprises a refractive optical element.

4. The apparatus of claim 3 wherein said refractive optical element comprises a refractive first surface and a reflective rear surface.

5. The apparatus of claim 4 wherein said reflective rear surface has a curvature.

6. The apparatus of claim 1 wherein said wavelength is not longer than approximately 250 nm.

7. The apparatus of claim 6 wherein said beam expanding telescope comprises a refractive optical element substantially of calcium fluoride ($CaF_2$).

8. The apparatus of claim 1 further comprising a dispersive optical element, said dispersive optical element disposed in said expanded beam portion, such that said expanded beam portion is retroreflected by said dispersive optical element.

9. The apparatus of claim 8 wherein said dispersive optical element is a diffraction grating disposed such that dispersion is substantially aligned in said first axis.

10. The apparatus of claim 8 wherein said beam expanding telescope is incorporated within the optical cavity of a laser.

11. The apparatus of claim 10 wherein said laser is an electric discharge laser.

12. The apparatus of claim 11 wherein said electric discharge laser is selected from the group consisting of KrF, ArF, and $F_2$ lasers.

13. A method of telescopically expanding an optical beam having a propagation axis and a substantially parallel incident optical beam portion, comprising:
    reflecting said incident optical beam from an optical element, thereby producing an expanding beam portion; and
    refracting said expanding beam portion from an optical element, thereby producing a substantially parallel expanded optical beam portion;
    such that beam expansion occurs in a first axis substantially perpendicular to the propagation axis of said incident optical beam portion; illuminating a diffraction grating with said expanded optical beam; and
    wherein said optical beam portion is deflected by an optical element in a plane substantially perpendicular to said first axis.

14. The method of claim 13 wherein said optical beam portion is reflected and refracted at the same optical element.

15. The method of claim 13 wherein said optical beam portion is deflected from an optical element in an axis substantially mutually perpendicular to said propagation axis and first axis.

16. The method of claim 13 wherein said expanded optical beam portion has a wavelength not longer than approximately 250 nm.

17. The method of claim 13 further comprising illuminating a dispersive optical element with said expanded beam portion, such that said expanded beam portion is retroreflected by said dispersive optical element.

18. The method of claim 17 wherein said dispersive optical element is a diffraction grating disposed such that dispersion is substantially aligned in said first axis.

19. The method of claim 17 wherein said beam expanding occurs within the optical cavity of a laser.

20. The method of claim 19 wherein said laser is an electric discharge laser.

21. The method of claim 20 wherein said electric discharge laser is selected from the group consisting of KrF, ArF and $F_2$ lasers.

22. An apparatus for transforming a light beam having a wavelength and a propagation axis, comprising:
    a catadioptric anamorphic beam expanding telescope having optical power in a first axis substantially perpendicular to said propagation axis; wherein said light beam includes an expanded beam portion that is expanded in said first axis by said beam expanding telescope; and
    a dispersive optical element, said dispersive optical element disposed in said expanded beam portion, such that said expanded beam portion is retroreflected by said dispersive optical element.

23. The apparatus of claim 22 wherein said light beam is deflected in a plane substantially perpendicular to said first axis.

24. The apparatus of claim 22 wherein said beam expanding telescope comprises a reflective optical element.

25. The apparatus of claim 22 wherein said beam expanding telescope comprises a refractive optical element.

26. The apparatus of claim 25 wherein said refractive optical element comprises a refractive first surface and a reflective rear surface.

27. The apparatus of claim 26 wherein said reflective rear surface has a curvature.

28. The apparatus of claim 22 wherein said wavelength is not longer than approximately 250 nm.

29. The apparatus of claim 28 wherein said beam expanding telescope comprises a refractive optical element substantially of calcium fluoride ($CaF_2$).

* * * * *